United States Patent
Choi (10) Patent No.: US 11,650,390 B2
(45) Date of Patent: May 16, 2023

(54) CAMERA MODULE

(71) Applicant: Do Young Choi, Suwon-si (KR)

(72) Inventor: Do Young Choi, Suwon-si (KR)

( * ) Notice: Subject to any disclaimer, the term of this patent is extended or adjusted under 35 U.S.C. 154(b) by 441 days.

(21) Appl. No.: 16/646,526

(22) PCT Filed: Nov. 2, 2017

(86) PCT No.: PCT/KR2017/012320
§ 371 (c)(1),
(2) Date: Mar. 11, 2020

(87) PCT Pub. No.: WO2019/066128
PCT Pub. Date: Apr. 4, 2019

(65) Prior Publication Data
US 2020/0301094 A1    Sep. 24, 2020

(30) Foreign Application Priority Data
Sep. 27, 2017   (KR) .......................... 10-2017-0125308

(51) Int. Cl.
*G03B 17/00*     (2021.01)
*G02B 7/02*      (2021.01)
(Continued)

(52) U.S. Cl.
CPC ............... *G02B 7/022* (2013.01); *G03B 3/02* (2013.01); *G03B 17/04* (2013.01); *H04N 23/51* (2023.01); *H04N 23/55* (2023.01); *H05K 1/02* (2013.01)

(58) Field of Classification Search
CPC ........ G02B 7/022; G03B 17/04; G03B 30/00; H04N 5/2251; H04N 5/2252; H04N 5/2254
See application file for complete search history.

(56) References Cited

U.S. PATENT DOCUMENTS 7,294,828 B2 * 11/2007 Kinoshita .............. H04N 1/024
                                                    257/434
7,664,390 B2 *  2/2010 Cho ....................... G03B 17/00
                                                    348/340
(Continued)

FOREIGN PATENT DOCUMENTS

CN        105093482 A       11/2015
JP         2004297282        10/2004
(Continued)

OTHER PUBLICATIONS

Raspberry Pi 3 V2 camera module; Pagnutti—Jan. 1, 2017. (Year: 2017).*

(Continued)

*Primary Examiner* — Luis Perez-Fuentes
(74) *Attorney, Agent, or Firm* — Stetina Brunda Garred and Brucker (57) ABSTRACT

A camera module according to the present invention may comprise: a barrel that accommodates a lens therein; a printed circuit board formed under the barrel and mounted with an image sensor; a body portion integrally formed with the barrel; a holder comprising a leg portion formed by being extended downward from the lower end of the body portion to the same height as the image plane of the lens; and a fixing portion formed downward from the leg portion to have a predetermined thickness to fix the holder to the printed circuit board, wherein the thickness of the fixing portion may be equal to the height from the upper surface of the printed circuit board to the image plane of the image sensor.

5 Claims, 4 Drawing Sheets

(51) Int. Cl.
*G03B 3/02* (2021.01)
*G03B 17/04* (2021.01)
*H05K 1/02* (2006.01)
*H04N 23/51* (2023.01)
*H04N 23/55* (2023.01)

(56) References Cited

U.S. PATENT DOCUMENTS

| | | | | |
|---|---|---|---|---|
| 8,792,043 | B2* | 7/2014 | Lee | H04N 23/55 |
| | | | | 348/340 |
| 9,769,361 | B2* | 9/2017 | Lee | H04N 23/51 |
| 10,498,942 | B2* | 12/2019 | Wang | H04N 23/55 |
| 10,623,614 | B2* | 4/2020 | Shen | G02B 7/025 |
| 2005/0099659 | A1* | 5/2005 | Wu | H01L 27/1462 |
| | | | | 257/E31.128 |
| 2006/0219885 | A1* | 10/2006 | Kinoshita | H04N 1/024 |
| | | | | 250/239 |
| 2009/0122426 | A1* | 5/2009 | Cheng | H04N 23/57 |
| | | | | 359/819 |

FOREIGN PATENT DOCUMENTS

| | | |
|---|---|---|
| KR | 100758584 | 9/2007 |
| KR | 20100030791 | 3/2010 |
| KR | 101220651 | 1/2013 |
| KR | 20150033088 | 4/2015 |
| KR | 1020160117401 | 10/2016 |

OTHER PUBLICATIONS

Raspberry Pi 3 V2 camera module; Pagnutti—2017 (Year: 2017).*
USPTO_Library NPL search query-2022. (Year: 2022).*
CNIPA, Office Action in corresponding Chinese Patent Application No. CN201780095173.8, dated Apr. 23, 2021, 4 pages.
Office Action for Korean Patent Application No. 1020170125308, dated Oct. 25, 2018, 5 pages.
Office Action for Korean Patent Application No. 1020170125308, dated Apr. 29, 2019, 5 pages.
PCT, Form PCT/ISA/210 for International Application No. PCT/KR2017/012320, dated Jun. 27, 2018, 3 pages.

* cited by examiner

CAMERA MODULE

CROSS-REFERENCE TO RELATED APPLICATIONS

This application is the National Phase of PCT International Application No. PCT/KR2017/012320, filed on Nov. 2, 2017, which claims priority under 35 U.S.C. 119(a) to Patent Application No. 10-2017-0125308, filed in the Republic of Korea on Sep. 27, 2017, all of which are hereby expressly incorporated by reference into the present application.

STATEMENT RE: FEDERALLY SPONSORED RESEARCH/DEVELOPMENT

Not Applicable

TECHNICAL FIELD

The present invention relates to a camera module, more specifically, relates to a camera module in which an image sensor is coupled to a printed circuit board mounted through a holder formed integrally with a lens barrel, and a fixing portion is disposed in a lower end portion of the holder which is formed to have the same thickness as the height of the image plane of an image sensor from an upper surface of the printed circuit board.

BACKGROUND ART

In general, adjustment of the focal point between a lens group and an image sensor of a camera module is accomplished as a vertical feed amount is adjusted by the rotation of a lens barrel which is screw coupled to the holder.

After the final focus is adjusted, an adhesive is injected between the holder and the lens barrel to adhere and fix them in a state of being focused.

Conventional camera module has a male screw portion on an outer circumferential surface of a lens barrel to which a lens group is coupled, and a female screw portion is formed on an inner circumferential surface of a holder to which a lens barrel is coupled so that the lens barrel and the holder are mutually assembled by the screw coupling between the male screw portion and the female screw portion.

However, due to the vertical feeding of the barrel which is screw coupled to the holder by rotating to the left and right in order to adjust the focal point of an image on an image sensor, foreign matters such as particles and the like generated by the friction between the holder and the screw coupling portion of the barrel fall on the top surface of an IR filter or the image sensor, thereby causing a problem that a foreign material defect occurs as the light receiving area of the image sensor is exposed.

In addition, in the conventional camera module, in the process of assembling the holder and the lens barrel by screw coupling, there has been a problem that a resolution failure may be generated due to inclination, that is, tilting, of the lens barrel may occur caused by the smearing of the screw coupling portion, and a longer working time is required for assembly.

DETAILED DESCRIPTION OF INVENTION

Technical Subject

The objective of the present invention that has been devised to solve the above problems is to provide a camera module which can omit a process of adjusting the focal point by integrally forming a barrel and a holder, and disposing a fixing portion being formed at a lower end portion of the holder to have a same thickness as the height from the upper surface of a printed circuit board to the image plane of an image sensor.

Technical Solution

A camera module according to the present invention may comprise: a barrel that accommodates a lens therein; a printed circuit board formed under the barrel and mounted with an image sensor; a body portion integrally formed with the barrel; a holder comprising a leg portion formed by being extended downward from the lower end of the body portion to the same height as the image plane of the lens; and a fixing portion formed downward from the leg portion to have a predetermined thickness to fix the holder to the printed circuit board, wherein the thickness of the fixing portion may be equal to the height from the upper surface of the printed circuit board to the image plane of the image sensor.

In addition, the fixing portion may comprise a first adhesive member interposed between a lower surface of the fixing portion and an upper surface of the printed circuit board.

In addition, it may further comprise a support portion being protruded and formed upward from an upper surface of the printed circuit board and having an outer circumferential surface being in contact with the outer circumferential surface of the fixing portion, thereby supporting the fixing portion.

In addition, it may comprise a second adhesive member interposed between an inner circumferential surface of the coupling portion and an outer circumferential surface of the support portion.

In addition, it may comprise a tank portion which is concavely formed downward from an upper surface of the printed circuit board along an outer circumference of the support portion.

In addition, a female screw portion may be formed in an inner circumferential surface of the fixing portion, and a male screw portion corresponding to the female screw portion may be formed in an outer circumferential surface of the support portion.

In addition, it may comprise a third adhesive member being applied to a region where the fixing portion and the support portion are screw coupled.

In addition, it may comprise a filter member disposed between the lens and the image sensor.

Advantageous Effects

The camera module according to the present invention has an effect of preventing the generation of foreign matters due to friction between a barrel and a holder during the process of adjusting the focal point by integrally forming the barrel and the holder.

In addition, there is an effect that a separate process of adjusting the focal point can be omitted by disposing a fixing portion being formed at the lower end portion of the holder to have the same thickness as the height from the upper surface of a printed circuit board to the image plane of an image sensor.

In addition, there is an effect of reducing the cost and time of the assembly process by omitting a separate process of adjusting the focal point.

BEST MODE

Hereinafter, some exemplary embodiments of the present invention will be described with reference to exemplary drawings for the convenience of description. In describing the reference symbols of the components in the drawings, the same components are denoted by the same reference numerals whenever possible, even if they are shown on other drawings.

The terms or words used in this specification and claims are not to be limited to the ordinary or dictionary meanings, and based on the principle that the inventor may appropriately define the concept of terms in order to best describe his or her invention in the best way, it should be interpreted as meaning and concept corresponding to the technical idea of the present invention. In addition, in describing the components of the exemplary embodiment of the present invention, terms such as first, second, A, B, (a), and (b) may be used. These terms are merely intended to distinguish the components from other components, and the terms do not limit the nature, order or sequence of the components. When a component is described as being "connected" or "coupled" to another component, the component may be directly connected or coupled to the other component, however, it should be understood that another element may be "connected" or "coupled" between components.

Therefore, since the configuration illustrated in the exemplary embodiments and drawings described in the specification are merely the most preferred exemplary embodiments of the present invention and do not represent all of the technical ideas of the present invention, it should be understood that there may be various equivalents and modified examples that may be substituted for them at the time of the present application. In addition, detailed descriptions of publicly known functions and configurations that may unnecessarily obscure the gist of the present invention will be omitted.

Hereinafter, the direction in which light is incident on the camera module may be described as "upward" or "upper", and the opposite direction may be described as "downward" or "lower".

Figure 1:
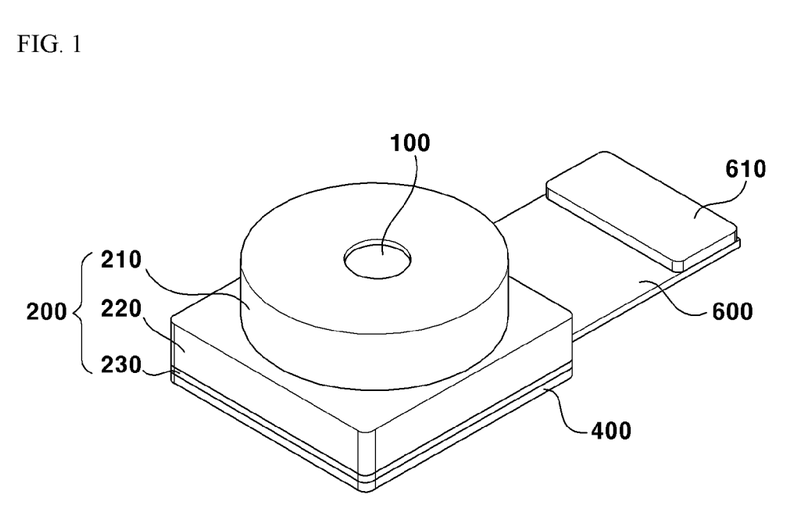
FIG. 1 is a schematic perspective view of a camera module according to an exemplary embodiment of the present invention.
Figure 2:
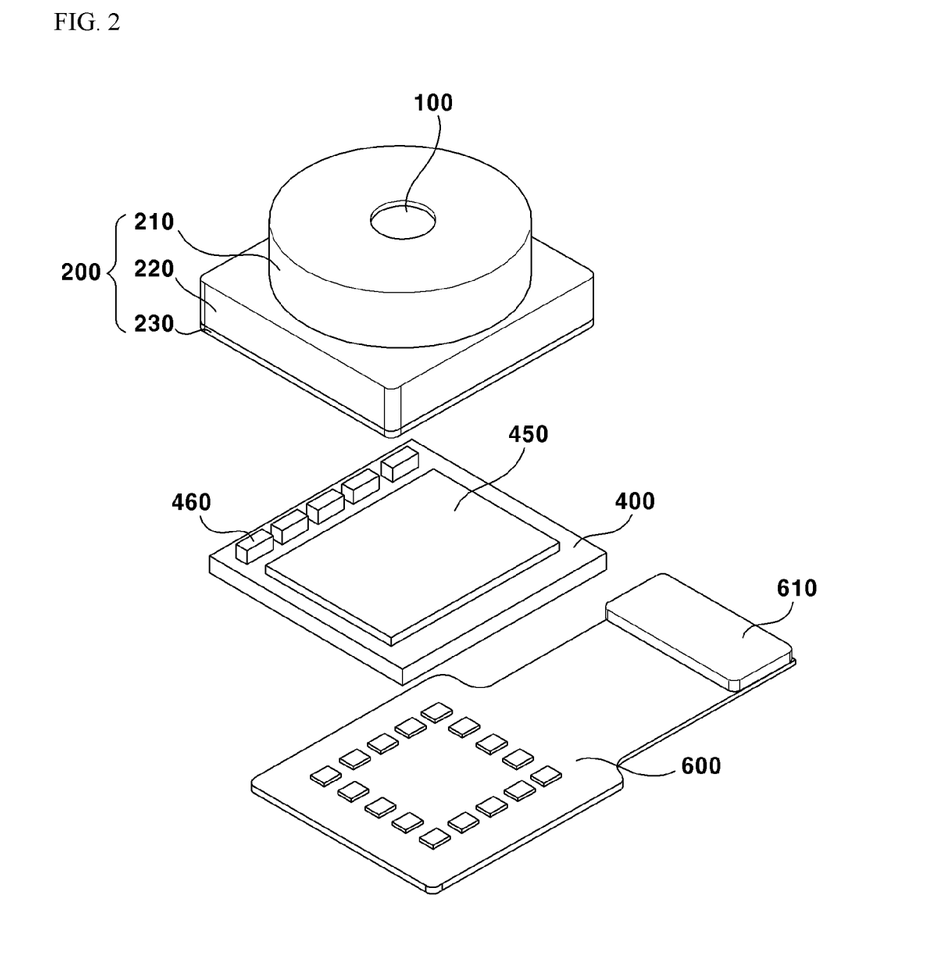
FIG. 2 is a schematic exploded perspective view of a camera module according to the exemplary embodiment of the present invention.
Figure 3:
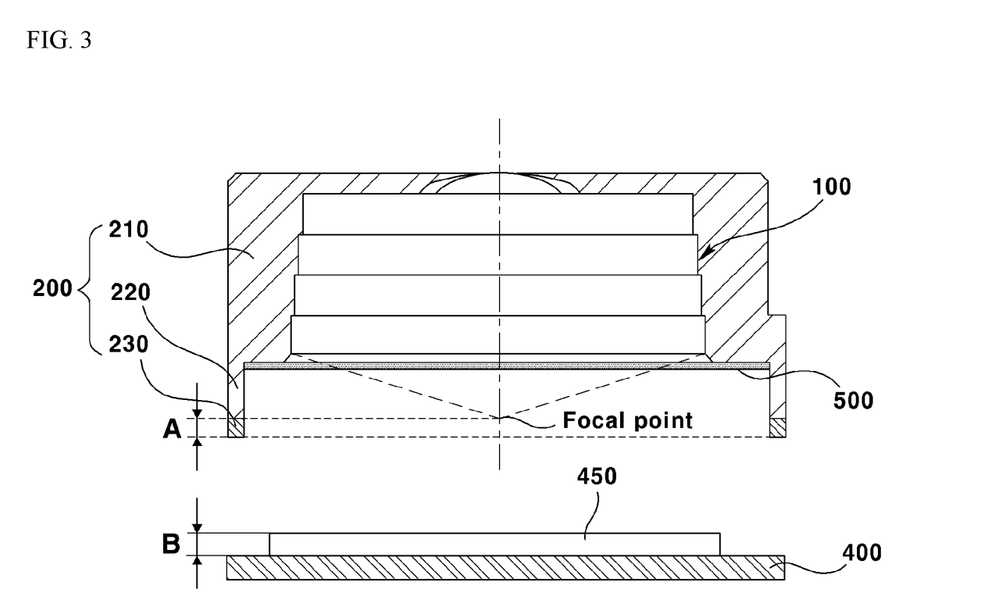
FIG. 3 is a schematic exploded cross-sectional view illustrating the thickness of a fixing portion of a camera module according to the first exemplary embodiment of the present invention.
Figure 4:
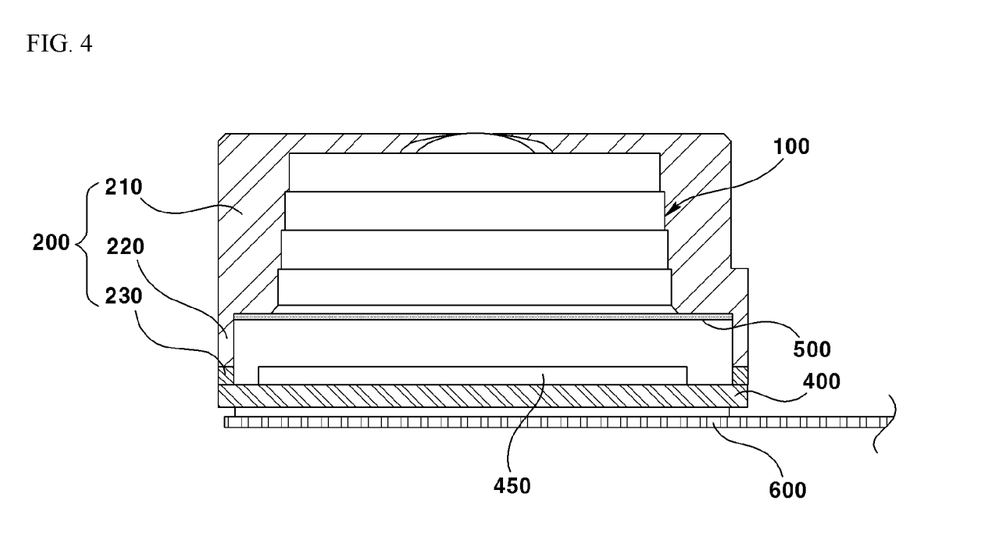
FIG. 4 is a schematic cross-sectional view illustrating a coupling structure between the fixing portion and the printed circuit board of FIG. 3.
Figure 5:
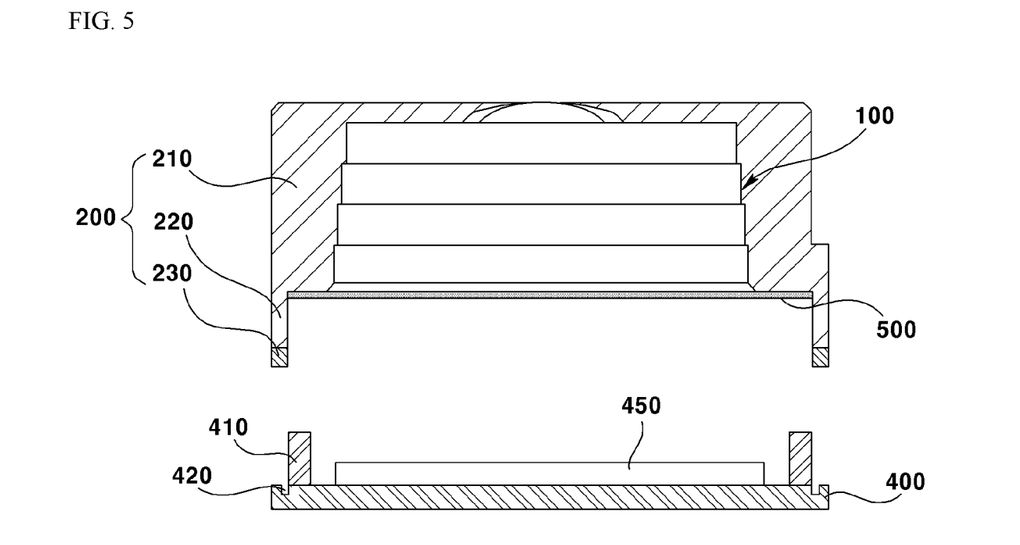
FIG. 5 is a schematic exploded cross-sectional view of a camera module according to a second exemplary embodiment of the present invention.
Figure 6:
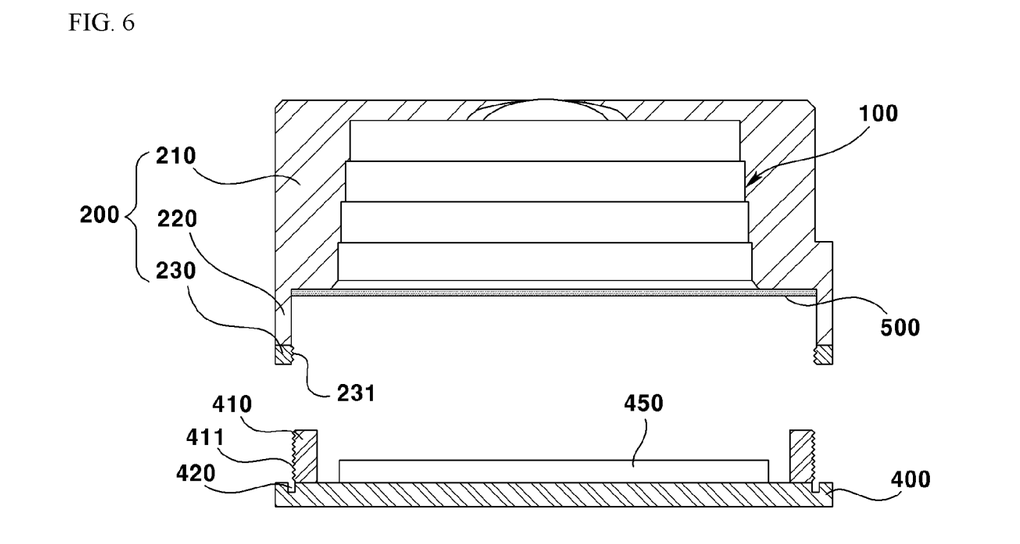
FIG. 6 is a schematic exploded cross-sectional view of a camera module according to a third exemplary embodiment of the present invention.

Hereinafter, exemplary embodiments of the present invention will be described in detail with reference to the accompanying drawings. FIG. 1 is a schematic perspective view of a camera module according to an exemplary embodiment of the present invention; FIG. 2 is a schematic exploded perspective view of a camera module according to the exemplary embodiment of the present invention; FIG. 3 is a schematic exploded cross-sectional view illustrating the thickness of a fixing portion of a camera module according to the first exemplary embodiment of the present invention; FIG. 4 is a schematic cross-sectional view illustrating a coupling structure between the fixing portion and the printed circuit board of FIG. 3; FIG. 5 is a schematic exploded cross-sectional view of a camera module according to a second exemplary embodiment of the present invention; and FIG. 6 is a schematic exploded cross-sectional view of a camera module according to a third exemplary embodiment of the present invention.

Referring to FIG. 1, a camera module according to an exemplary embodiment of the present invention may comprise a barrel, a holder 200 supporting the barrel, and a printed circuit board 400 coupled to a lower side of the holder 200. Hereinafter, the printed circuit board 400 comprising an image sensor 450 mounted on the printed circuit board 400 may be described as a "substrate assembly".

At least one lens 100 may be accommodated in the barrel. At this time, each lens 100 may be disposed to be spaced apart by a predetermined distance. Through such a lens 100, a light reflected by a subject may be incident into the camera module. As the light is refracted while being incident through the at least one lens 100, a focal point may be formed at a point on an optical axis below the lens 100. In the exemplary embodiment of the present invention, since the separation distance between each lens 100 is fixed, the focal point may be fixed.

For convenience, the barrel is given a separate name, but it should be understood as a conceptual separation, not a physical separation. Therefore, in the exemplary embodiment of the present invention, the barrel may be integrally formed with the holder 200. Since the barrel is integrally formed with the holder 200 inside the holder 200, at least one or more lenses 100 may be fixedly disposed inside the holder 200. Therefore, in the exemplary embodiment of the present invention, in the assembly process of the camera module, the process of vertically moving the barrel, which accommodates the lens 100, in the optical axis direction inside the holder 200 to adjust the focal point can be omitted. Accordingly, unlike the prior art, foreign matters that may occur by vertically moving the barrel being coupled with the holder 200 may be suppressed.

The holder 200 may be integrally formed with a barrel that accommodates at least one lens 100. The holder 200 may be integrally formed in a state where the lens 100 is accommodated therein, and may be formed, for example, by insert injection molding. The holder 200 may comprise a body portion 210 integrally formed in a state in which the barrel is accommodated therein and a leg portion 220 extending downward from a lower end portion of the body portion 210. The holder 200 may be disposed in the printed circuit board 400. The holder 200 may be disposed in an upper surface of the printed circuit board 400. The holder 200 may serve to fixedly dispose the lens 100 on the upper side of the image sensor 450 mounted on the upper surface of the printed circuit board 400.

The body portion 210 may be formed integrally with the barrel. That is, the body portion 210 may accommodate at least one or more lenses 100 inside. At this time, the lens 100 may be disposed vertically with respect to the optical axis inside the body portion 210, and each lens 100 may be disposed to be parallel to each other and disposed to be spaced apart from each other. Since the lens 100 is fixedly disposed in the body 210, the focal point formed by the lens 100 in the process of forming the holder 200 may also be fixed. The outer periphery of the body portion 210 may be formed to have a circular or rectangular shape, but is not limited thereto.

A filter member may be disposed in the lower side of the body portion 210. The filter member 500 may be attached to the lower surface of the body portion 210, but is not limited thereto, and may be disposed between the image sensor 450 and the lens 100 disposed at the lowermost side among the at least one lens 100. At this time, the filter member may be an ultraviolet blocking filter that blocks ultraviolet rays contained in light incident through the lens 100.

Holder 200 may comprise a leg portion 220. The leg portion 220 may be extended downward from the lower end of the body portion 210. The leg portion 220 may be integrally formed with the body portion 210. The leg portion 220 may be formed to have a predetermined height. As illustrated in FIG. 3, in the exemplary embodiment of the present invention, the height of the leg portion 220 may be formed to have the same height as a focal point fixedly formed at the lower side of the lens 100. The lower surface of the leg portion 220 may be formed at the same height as the focal point fixedly formed at the lower side of the lens 100.

In the present invention, the leg portion 220 and the fixing portion 230, which will be described later, are described in separate configurations, which may be physical separation, but even if in the case where the leg portion 220 and the fixing portion 230 are physically integrally formed, it may be understood that both are conceptually separated.

A fixing portion 230 for fixing the holder 200 to the printed circuit board 400 may be formed in the lower side of the leg portion 220 of the holder 200. The fixing portion 230 may be disposed in the lower side of the leg portion 220. The fixing portion 230 may be formed by being extended downward from the leg portion 220. The fixing portion 230 may be integrally formed with the leg portion 220. Unlike this, the fixing portion 230 may also be manufactured in a manner wherein it is combined with the leg portion 220 after being manufactured as a separate member having the same thickness as the height from the upper surface of the printed circuit board 400 to the image plane of the image sensor 450. A space portion may be formed in the inner side from the leg portions 220 and the fixing portion 230 to allow light incident through the lens 100 to penetrate up to the image sensor 450. The lower surface of the fixing portion 230 may be in contact with the upper surface of the printed circuit board 400. The lower surface of the fixing portion 230 may be in contact with the upper surface of the printed circuit board 400 at the outer side of the image sensor 450. The fixing portion 230 may be fixed to the printed circuit board 400 in a state where a lower surface thereof is in contact with the upper surface of the printed circuit board 400. At this time, the thickness of the fixing portion 230 may be formed to be the same as the height from the upper surface of the printed circuit board 400 to the image plane of the image sensor 450. Thus, as the lower surface of the fixing portion 230 is in contact with the upper surface of the printed circuit board 400, the focal point of the lens 100 may be formed at the same height as the image plane of the image sensor 450.

The camera module according to an exemplary embodiment of the present invention may comprise a printed circuit board 400. The printed circuit board 400 may be disposed in the lower side of the lens 100. The printed circuit board 400 may be disposed to be perpendicular to the optical axis of the lens 100. The printed circuit board 400 may be a rigid printed circuit board 400. The image sensor 450 may be mounted on the upper surface of the printed circuit board 400. An image plane in which images are formed by incident light may be formed in the image sensor 450. The image plane may be formed in the upper portion of the image sensor 450. The image sensor 450 and the printed circuit board 400 may be electrically connected, for example, may be connected by a wire bonding method, but is not limited thereto. The printed circuit board 400 may be coupled with a holder 200 which is integrally formed with a barrel that accommodates at least one or more lenses 100. The upper surface of the printed circuit board 400 may be in contact with the lower surface of the fixing portion 230 extending from a leg portion 220 of the holder 200. The leg portion 220 may be disposed outside the region where the image sensor 450 is mounted on the upper surface of the printed circuit board 400. When the upper surface of the outer circuit board and the lower surface of the fixing portion 230 are in contact with each other, the height of the focal point of the lens 100 fixedly accommodated in the holder 200 and the height of the image plane where the image is formed on the image sensor 450 may be equally formed. Therefore, both may be fixed to each other in a state wherein the lower surface of the fixing portion 230 and the upper surface of the printed circuit board 400 are in contact with each other. As a result, a separate adjustment process for focus adjustment can be omitted.

The image sensor 450 may be mounted on the upper surface of the printed circuit board 400. The image sensor 450 may be aligned with the optical axis of the lens 100. The image sensor 450 may be any one of a charge coupled device (CCD), a complementary metal oxide semi-conductor (CMOS), a CPD, and a CID. The image sensor 450 may be formed at the same height as the focal point formed by the lens 100 to form an image plane in which an image is formed by an incident light.

In addition, in the outer side of the area where the image sensor 450 is mounted in the printed circuit board 400, a circuit component 460 comprising other passive and active devices usable in other camera modules as well as the image signal processor (ISP) may be disposed. The circuit component 460 may be mounted through surface mount technology (SMT).

The camera module may further comprise a connection member 600 for transmitting the electrical signal converted by the image sensor 450 to an external electronic device. At this time, the connection member 600 may be a flexible printed circuit board (FPCB). One end of the connection member 600 may be electrically connected to a lower surface of the printed circuit board 400 in which the image sensor 450 is mounted, and the other end may be electrically connected to the external electronic device.

Hereinafter, a method of fixing the fixing portion 230 of the holder 200 to the printed circuit board 400 will be described with reference to various exemplary embodiments.

As illustrated in FIGS. 3 and 4, the first exemplary embodiment of the present invention may comprise a first adhesive member disposed between the lower surface of the fixing portion 230 and the upper surface of the printed circuit board 400 in order to mutually fix the fixing portion 230 and the printed circuit board 400 in a state of being in contact with each other. At this time, the first adhesive member may be an epoxy, but is not limited thereto.

As illustrated in FIG. 5, in a second exemplary embodiment of the present invention, a support portion 410 may be protruded from the upper surface of the printed circuit board 400. The support portion 410 may be disposed at a position corresponding to the inner circumference of a fixing portion 230. An inner circumferential surface of the fixing portion 230 and an outer circumferential surface of the support portion 410 may be in contact with each other to support each other. However, the position of the support portion 410 is not limited thereto, and may be formed at a position corresponding to the outer circumference of the fixing portion 230, and in this case, it may be described as an outer circumferential surface of the fixing portion 230 and an inner circumferential surface of the support portion 410 are being in contact with each other. Hereinafter, the support portion 410 will be described as being in contact with the inner circumferential surface of the fixing portion 230. A second adhesive member may be interposed between the inner circumferential surface of the fixing portion 230 and the outer circumferential surface of the support portion 410. When the fixing portion 230 is fixed to the outer peripheral surface of the support portion 410 by the second adhesive member, in order to prevent the second adhesive member from flowing down to the lower surface of the fixing portion 230, a tank portion 420, which is formed concave downward, may be disposed along the outer circumference of the support portion 410 in the upper surface of the printed circuit board 400 corresponding to the lower end portion of the outer peripheral surface of the support portion 410.

In the process wherein the inner circumferential surface of the fixing portion 230 is sliding downwards by the outer circumferential surface of the support portion 410, the second adhesive member interposed therebetween may flow downward, and such second adhesive member may be accommodated in the tank portion 420. This is to prevent an error in the height of the focal point that may occur due to the second adhesive member being flowed between the lower surface of the fixing portion 230 and the upper surface of the printed circuit board 400. In the first to second exemplary embodiments of the present invention, the inner circumferential surface of the fixing portion 230 may be formed to have a circular or rectangular shape, but is not limited thereto. In the above described first exemplary embodiment and the second exemplary embodiment, shapes of the inner circumferential surfaces of the fixing portions 230 and the leg portions 220 may be rectangular or circular, but are not limited thereto.

As illustrated in FIG. 6, in a third exemplary embodiment of the present invention, a fixing portion 230 and a support portion 410 may be screw coupled together. In the third exemplary embodiment, the inner circumferential surface of the fixing portion 230 and the outer circumferential surface of the support portion 410 may be screw coupled. A female screw portion may be formed on an inner circumferential surface of the fixing portion 230, and a female screw portion corresponding to the outer circumferential surface of the support portion 410 may be formed. Although, as described above, the position of the support portion 410 may be disposed outside the fixing portion 230 to be coupled to the outer circumferential surface of the fixing portion 230, however, in the exemplary embodiment, it is preferable that the outer circumferential surface of the support portion 410 and the inner circumferential surface of the fixing portion 230 are disposed to be screwed with each other in order to prevent foreign matters that may occur during the screw coupling process from being introduced into the image sensor 450. In the third exemplary embodiment, a third adhesive member may be applied to a portion where the inner circumferential surface of the fixing portion 230 and the outer circumferential surface of the support portion 410 are screw coupled together. In addition, a tank portion 420 formed concave downward may be disposed along the outer circumference of the support portion 410 in the upper surface of the printed circuit board 400 corresponding to the lower end portion of the outer circumferential surface of the support portion 410. The tank portion 420 may accommodate a third adhesive member being flowed downward in the screw coupling process of the fixing portion 230 and the support portion 410. This is to prevent an error from occurring in the height of the focal point of the lens 100 caused by the third adhesive member being flowed between the lower surface of the fixing portion 230 and the upper surface of the printed circuit board 400. The shape of the inner circumferential surface of the fixing portion 230 and the leg portion 220 in the third exemplary embodiment of the present invention is preferably formed in a circular shape.

The first to third adhesive members in the exemplary embodiment of the present invention may be a curable adhesive that is cured by heat or light, and may be, for example, an epoxy, but is not limited thereto.

In the present invention, the barrel in which the lens 100 is accommodated is integrally formed with the holder 200, the holder 200 is directly coupled to the upper surface of the printed circuit board 400, the thickness of the fixing portion 230 for fixing to the printed circuit board 400 is formed to be the same as the height from the upper surface of the printed circuit board 400 to the image plane of the image sensor 450, and thereby the camera module has technical features in that the focus of the lens 100 coincides with the image plane on the image sensor 450 without a separate process of adjusting the focal point.

In general, in the case of the camera module of non-focusing type, the focus may be determined at a point on the optical axis of the rear side (here the lower side) of the lens 100 as the at least one lens 100 is accommodated and mounted inside the barrel. In the present invention, since the barrel for accommodating the lens 100 is formed integrally with the holder 200, it has a structure wherein the height of the focus cannot be adjusted by moving the barrel in the optical axis direction as in the prior art.

However, since the position where the focal point of the lens 100 is formed is determined according to the structure disposing at least one or more lenses 100 inside the holder 200, the leg portion 220 of the holder 200 may be formed to have a height at which the focal point of the lens 100 is formed.

In addition, the height from the upper surface of the printed circuit board 400 to the image plane of the image sensor 450 is measured, and the thickness of the fixing portion 230 is formed to be the same so that the lower surface and the printed circuit of the fixing portion 230 and the upper surface of the substrate 400 are disposed to be in contact with each other, and thereby the focal point may coincide with the image plane of the image sensor 450 without a separate process of adjusting the focal point.

Hereinafter a manufacturing method of a camera module according to the present invention will be described. First, in a state in which the image sensor 450 is mounted on the printed circuit board 400, the height A from the upper surface of the printed circuit board 400 to the image plane of the image sensor 450 may be measured. At this time, the value A may vary depending on the image sensor 450 being used. The thickness B of the fixing portion 230 is made to have the same thickness as the measured value A, and thereby the fixing portion 230 of the holder 200 may be formed at the lower side of the leg portion 220 of the holder 200. In addition, a process of further forming the support portion 410 in the upper surface of the printed circuit board 400 may be included in order to couple the fixing portion 230 to the printed circuit board 400. A process of assembling the holder 200 and the substrate through the above described adhesive member or screw coupling in a state in which the fixing portion 230 formed in the lower portion of the holder 200 is in contact with the printed circuit board 400 may be included.

At this time, in managing the holder 200 and the substrate assembly manufactured by the method described above, even when the number or layout of the lens 100 disposed inside the holder 200 is different, as shown in Table 1 below, the value B, which is the thickness of the fixing portion 230 of the individual holder 200, can be separately managed therefore immediate assembling is possible for the substrate assembly having the same value A. At this time, each of the value A (A1 to A5) and the value B (B1 to B5) in Table 1 below may be a value within an allowable error range during a normal process of adjusting the focal point.

TABLE 1

| Classification | Combination #1 | Combination #2 | Combination #3 | Combination #4 | Combination #5 |
|---|---|---|---|---|---|
| A | A1 | A2 | A3 | A4 | A5 |
| B | B1 | B2 | B3 | B4 | B5 |

As described above, the camera module according to the exemplary embodiment of the present invention may omit a separate process of adjusting the focal point to coincide the focal point of the lens 100 with the image plane of the image sensor 450 in the assembly process of the camera module. Therefore, there are effects that the fixing time and cost can be reduced, and the image quality failure due to the fine foreign matters that can occur during the process of adjusting the focal point can be suppressed.

In the above description, all components constituting the embodiments of the present invention are described as being combined or operating in combination, but the present invention is not necessarily limited to the embodiments. In other words, within the scope of the purpose of this invention, all of those components may operate in selective combinations of one or more components. In addition, the term "include", "comprise", or "have" described above means that the corresponding components can be embedded unless there is an opposite description therefore it should be interpreted that other components may further be comprised in addition to those corresponding components. All terms, including technical and scientific terms, have the same meaning as commonly understood by one of ordinary skill in the art to which this invention belongs, unless otherwise defined. Commonly used terms, such as predefined terms, should be interpreted to be consistent with the contextual meanings of the related art, and are not to be construed as ideal or excessively formalistic, unless expressly defined to the contrary.

The above description is only to those described as the technical idea of the present invention by way of example, and those skilled in the art will appreciate that various modifications and variations can be made without departing from the essential features of the present invention. Therefore, the embodiments disclosed in the present invention are not intended to limit the technical idea of the present invention but to describe the present invention, and the scope of the technical idea of the present invention is not limited by these embodiments. The protection scope of the present invention should be interpreted by the following claims, and all technical ideas within the equivalent scope should be interpreted as being included in the scope of the present invention.

What is claimed is:

1. A camera module comprising:
   a barrel that accommodates a lens therein;
   a printed circuit board formed under the barrel and mounted with an image sensor;
   a body portion integrally formed with the barrel and having the lens disposed therein;
   a holder comprising a leg portion formed by being extended downward from the lower end of the body portion to the same height as the image plane of the lens;
   a fixing portion formed downward from the leg portion to have a predetermined thickness to fix the holder to the printed circuit board;
   a support portion being protruded and formed upward from an upper surface of the printed circuit board and having an outer circumferential surface being in contact with the outer circumferential surface of the fixing portion, thereby supporting the fixing portion;
   a second adhesive member interposed between an inner circumferential surface of the coupling portion and an outer circumferential surface of the support portion; and
   a tank portion which is concavely formed downward from an upper surface of the printed circuit board along an outer circumference of the support portion,
   wherein the body portion, the leg portion and the fixing portion are formed of the same material as one body,
   wherein the thickness of the fixing portion may be equal to the height from the upper surface of the printed circuit board to the image plane of the image sensor;
   wherein the leg portion and an inner peripheral surface of the fixing portion are disposed outside the inner peripheral surface of the body portion.

2. The camera module according to claim 1, wherein the fixing portion comprises a first adhesive member interposed between a lower surface of the fixing portion and an upper surface of the printed circuit board.

3. The camera module according to claim 1, wherein a female screw portion is formed in an inner circumferential surface of the fixing portion, and a male screw portion corresponding to the female screw portion is formed in an outer circumferential surface of the support portion.

4. The camera module according to claim 1, comprising:
   a third adhesive member being applied to a region where the fixing portion and the support portion are screw coupled.

5. The camera module according to claim 1, comprising:
   a filter member disposed between the lens and the image sensor.

* * * * *